(12) United States Patent
Muranaka et al.

(10) Patent No.: US 6,358,329 B1
(45) Date of Patent: Mar. 19, 2002

(54) RESIST RESIDUE REMOVAL APPARATUS AND METHOD

(75) Inventors: Seiji Muranaka; Itaru Kanno, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/342,536

(22) Filed: Jun. 29, 1999

(30) Foreign Application Priority Data

Jan. 7, 1999 (JP) .......................................... 11-002244

(51) Int. Cl.[7] .............................. B08B 3/00; B08B 7/00
(52) U.S. Cl. .............................. 134/26; 134/30; 134/33
(58) Field of Search ............................... 134/2, 26, 28, 134/29, 30, 31, 33, 37

(56) References Cited

U.S. PATENT DOCUMENTS 5,007,981 A * 4/1991 Kawasaki et al. .............. 134/3
5,567,574 A * 10/1996 Hasemi et al. ................. 134/39
5,980,643 A * 11/1999 Jolley ............................ 134/2
6,217,667 B1 * 4/2001 Jolley ............................ 134/2

FOREIGN PATENT DOCUMENTS

| JP | 3-166724 | 7/1991 |
| JP | 4-356927 | 12/1992 |
| JP | 6-181191 | 6/1994 |

* cited by examiner

Primary Examiner—Randy Gulakowski
Assistant Examiner—S. Chaudhry
(74) Attorney, Agent, or Firm—McDermott, Will & Emery

(57) ABSTRACT

The resist residue removal method removes resist residues caused at the time of formation of an aluminum wiring pattern on a semiconductor wafer. The method includes the steps of removal fluid processing, washing, and drying. The method involves forming an atmosphere within a chamber, which houses a semiconductor wafer having an exposed aluminum wiring pattern, by controlling gas flow into the chamber according to the processing step being performed. By the resist residue removal method, yield of a wiring pattern is improved by prevention of local etching of an aluminum wiring pattern, or by prevention of thinning of the aluminum wiring pattern.

16 Claims, 4 Drawing Sheets

Process of Removal of Resist Residues

RESIST RESIDUE REMOVAL APPARATUS AND METHOD

BACKGROUND OF THE INVENTION

1. Field of the Invention

The present invention relates to a resist residue removal apparatus and method, and more particularly, to an apparatus and method for removing resist residues after formation of an aluminum (Al) wiring pattern constituting a semiconductor integrated circuit.

2. Background Art

Miniaturization of a semiconductor integrated circuit is pursued in order to realize a high-speed, high-performance device. Miniaturization is required not only for an element section such as a transistor which acts as a drive section of the device but also for a multilayer wiring section.

In a case where aluminum (Al) is used for a wiring pattern, an aluminum wiring pattern is formed on a semiconductor device through sputtering of an aluminum alloy. A resist film is grown on the aluminum wiring pattern and is subjected to patterning and dry etching, thereby fine pattern processing of a semiconductor devices is carried out.

As a result, the aluminum wiring pattern may be diminished until it becomes equal in size to a hole which interconnects multilayer wiring patterns. As a result, a phenomenon may occur in which the interconnection hole is not completely covered with the aluminum wiring pattern.

An aluminum wiring pattern, which is offset from the interconnection hole so that the surface of the interconnection hole is exposed after formation of the aluminum wiring pattern, is called a borderless wiring pattern or a misalignment wiring pattern.

The resist pattern is removed from the semiconductor device including the borderless wiring pattern through ashing by use of oxygen plasma. However, the resist film cannot be completely removed through ashing, and resist still remains on the semiconductor device. For this reason, the wafer is subjected to a processing with a resist residues removal fluid and is rinsed with water.

FIG. 5 is a schematic representation showing the structure of a borderless wiring pattern that has been subjected to resist residue removal processing. In the drawing, reference numeral 1 designates an interlayer dielectric film; 2 designates an interconnection hole formed in the interlayer dielectric film; 3 designates a conductive material which is filled in the interconnection hole to thereby constitute a plug; 4 designates a barrier metal layer formed on the interlayer dielectric film; and 5 designates an aluminum wiring pattern partly connected to the plug 3 of the interconnection hole 2.

Resist residue processing performed on a conventional semiconductor device having an aluminum wiring pattern involves the following problems.

More specifically, since aluminum is susceptible to erosion, aluminum may becomes thinner during rinsing process subsequent to removal fluid processing. Further, during the rinsing process, aluminum contained in the aluminum wiring pattern and a plug material (such as W) become eroded as a result of a local galvanic battery effect, and the aluminum wiring pattern 5 on the plug 3 may often become etched.

Copper (Cu) is sometimes added to the aluminum wiring pattern 5 in order to improve electromigration resistance. In many types of resist removal fluids currently used on such an aluminum wiring pattern, when the resist removal fluid is mixed with a large volume of water during the rinsing process, a component effective for removing resist residues becomes ionized, which in turn increases the reactivity of the resist removal fluid as well as the fluid's corrosive effect on aluminum. As a result, aluminum present around the copper (Cu) contained in the aluminum wiring pattern is etched, whereby copper (Cu) is precipitated.

This results in the deterioration of characteristics, such as a decrease in the yield of wiring patterns, an increase in wire resistance, and a drop in the reliability of a wiring pattern.

SUMMARY OF THE INVENTION

The present invention has been conceived to solve such a problem, and the object of the present invention is to provide a resist residue removal apparatus and method which enable improvement in the yield of wiring patterns by retarding local etching of an aluminum wiring pattern. Another object is to prevent an increase in the resistance of an aluminum wiring pattern by prevention of a reduction in the width thereof; and further object is to prevent precipitation of copper (Cu) in a Cu-containing aluminum wiring pattern.

According to one aspect of the present invention, there is provided an improved resist residue removal system for removing resist residue on a semiconductor wafer having an aluminum wiring pattern thereon. The system comprises at least a processing chamber for processing a wafer having resist residues, and the processing includes a removal fluid processing, washing, and drying. An apparatus is provided for introducing a specific gas selected from a group of oxidizing gas and non-oxidizing gas into the processing chamber corresponding to the type of the processing.

According to another aspect of the present invention, there is provided an improved method of removing resist residues from a semiconductor wafer having an aluminum wiring pattern thereon. In the method, the wafer is processed with a resist residues removal fluid in a processing chamber. Then, the wafer is washed with a washing fluid in a processing chamber. Then, the wafer is dried with a drying gas in a processing chamber. The atmosphere of the processing chamber is controlled according to the processing to which the semiconductor wafer is subjected.

Other and further objects, features and advantages of the invention will appear more fully from the following description.

DETAILED DESCRIPTION OF THE EMBODIMENTS

First Embodiment

Figure 1:
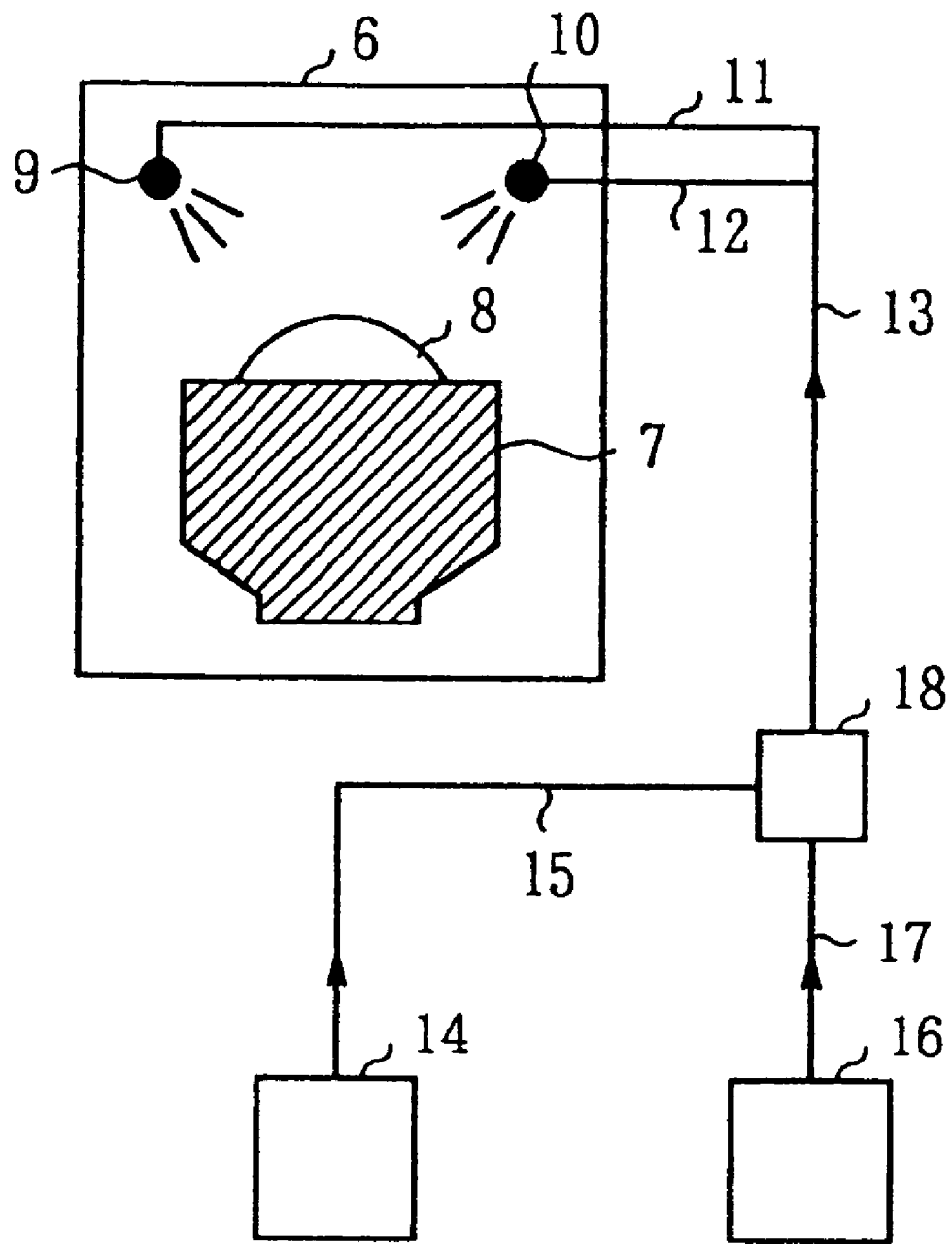
FIG. 1 is a schematic diagram showing a spray type resist residual removal apparatus and method according to a first embodiment of the present invention.

A first embodiment of the present invention will now be described by reference to the accompanying drawings. FIG.

1 is a schematic diagram showing a spray type resist residual removal apparatus and method according to a first embodiment of the present invention.

In the drawing, reference numeral 6 designates a chamber which acts as a processing chamber; 7 designates a cassette which is provided in the chamber so as to be able to rotate; 8 designates a semiconductor wafer which is a material to be processed retained on the cassette; 9 and 10 designate nozzles which are provided in the upper part of the chamber and discharge gas; 11 and 12 designate pipes connected to the nozzles 9 and 10, respectively; 13 designates a pipe connected to the pipes 11 and 12; 14 designates a source for supplying an oxidizing gas such as dry air; 15 designates an oxidizing gas supply pipe connected to the oxidizing gas supply source; 16 designates a source for supplying a non-oxidizing gas such as nitrogen gas; 17 designates a non-oxidizing gas supply pipe connected to the non-oxidizing gas supply source; and 18 designates a changeover valve connected to the pipes 13, 15, and 17 for switching connection of the pipe 13 between the pipe 15 and the pipe 17.

Figure 2:
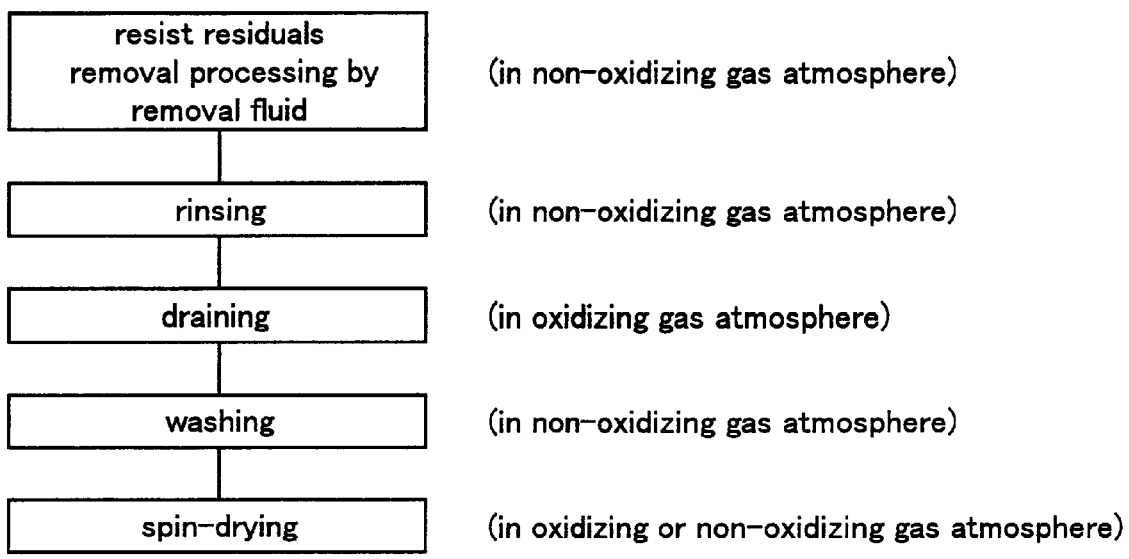
FIG. 2 shows a flowchart of a general processing process in the present invention.

As can be seen from the flowchart of a general processing process shown in FIG. 2, removal of resist residues from the semiconductor wafer 8 is carried out, following the removal of the resist pattern, in sequence of a removal fluid processing step, a rinsing step, a draining step, a washing step, and a spin-drying step. In each step, a chemical or dry air required in the step is applied to the semiconductor wafer 8 from an non-illustrated spraying device under a known method while the cassette 7 is rotated.

Here, the rinsing and draining steps may be omitted.

Now, an example of the first embodiment is explained which includes a resist residues removal process by a removal fluid, rinsing step, draining process, water-washing process and spin-drying process.

The first embodiment is characterized in that the atmosphere in the chamber 6 is controlled for each step according to the progress of the processing from one step to the next.

More specifically, in the removal fluid processing of the resist residues in the first step, the changeover valve 18 is switched to the pipe 17, and the resist removal fluid is supplied to the chamber 6 while a non-oxidizing gas is being supplied to the same. Thus, thinning of an aluminum wiring pattern may be prevented, or precipitation of Cu may be prevented, which would otherwise be caused by etching aluminum around Cu contained in the aluminum wiring pattern.

In the rinsing process in the second step, as in the case with the first step, a rinsing fluid is supplied to the chamber 6 while non-oxidizing gas is being supplied to the same.

As a result, there can be prevented reaction of aluminum, which would otherwise be caused during rinsing.

The draining operation in the third step is performed while oxidizing gas is being supplied to the chamber 6.

In this step, the resist residues removal fluid is removed from the semiconductor wafer 8, and the surface of the semiconductor wafer 8 is exposed to the atmosphere within the chamber 6. At this time, the chamber 6 is filled with oxidizing gas, thereby rendering the aluminum wiring pattern 5 formed on the plug 3 passive through oxidation. Consequently, there is prevented etching of the aluminum wiring pattern 5, which would otherwise be caused in a subsequent processing step by a local galvanic battery effect.

A water-washing operation in the fourth step and a spin-drying operation in the fifth step are carried out while non-oxidizing gas is supplied to the chamber 6. As in the case with the first step, there is prevented thinning of an aluminum wiring pattern, and as well there is prevented precipitation of Cu, which would otherwise be caused by etching of aluminum around Cu included in the aluminum wiring pattern.

According to the first embodiment, in each processing step, control of the atmosphere within the chamber 6 must be established for each processing step within a short period of time, such as a few seconds.

Second Embodiment

Figure 3:
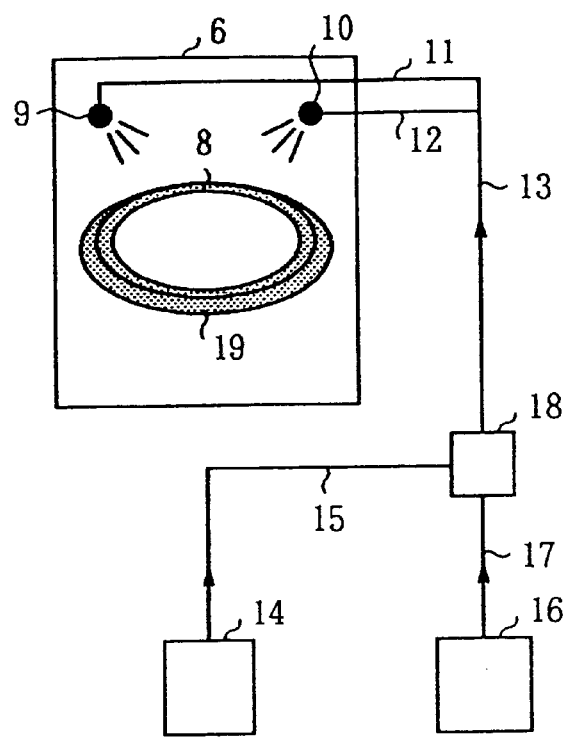
FIG. 3 is a schematic diagram showing a single wafer type resist residue removal apparatus and method according to the second embodiment.

A second embodiment of the present invention will now be described by reference to FIG. 3. FIG. 3 is a schematic diagram showing a single wafer type resist residue removal apparatus and method according to the second embodiment.

Those elements that are identical with or correspond to those shown in FIG. 1 are assigned the same reference numerals, and repetition of their explanations is omitted.

The apparatus shown in FIG. 3 is different from that shown in FIG. 1 in that there is provided a table for supporting the semiconductor wafer 8, in the form of a single wafer table 19.

The resist residue removal step is identical with that in the first embodiment, and hence its explanation is omitted.

Third Embodiment

Figure 4:
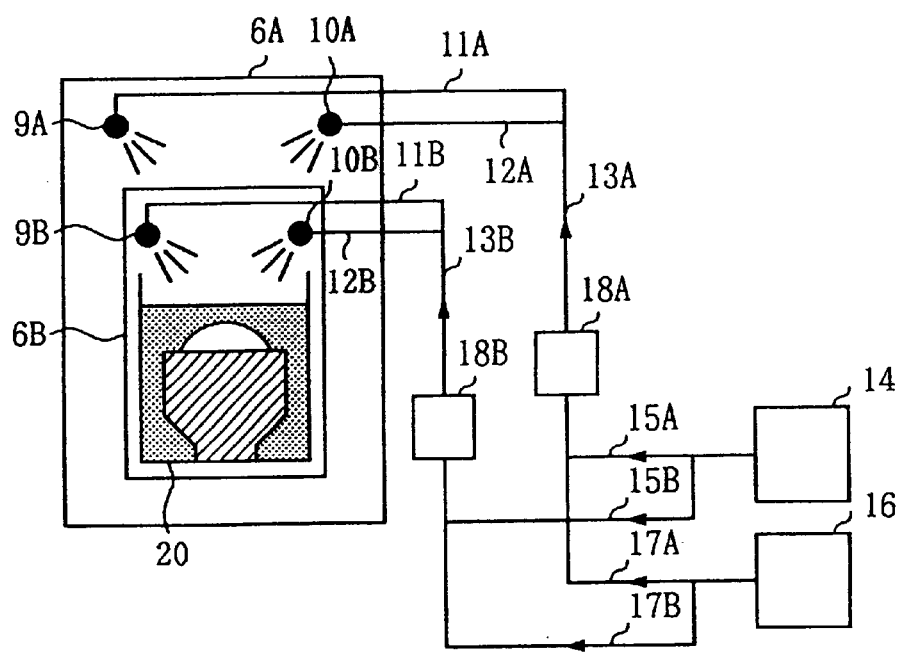
FIG. 4 is a schematic diagram showing a dip type resist residue removal apparatus and method according to a third embodiment.
Figure 5:
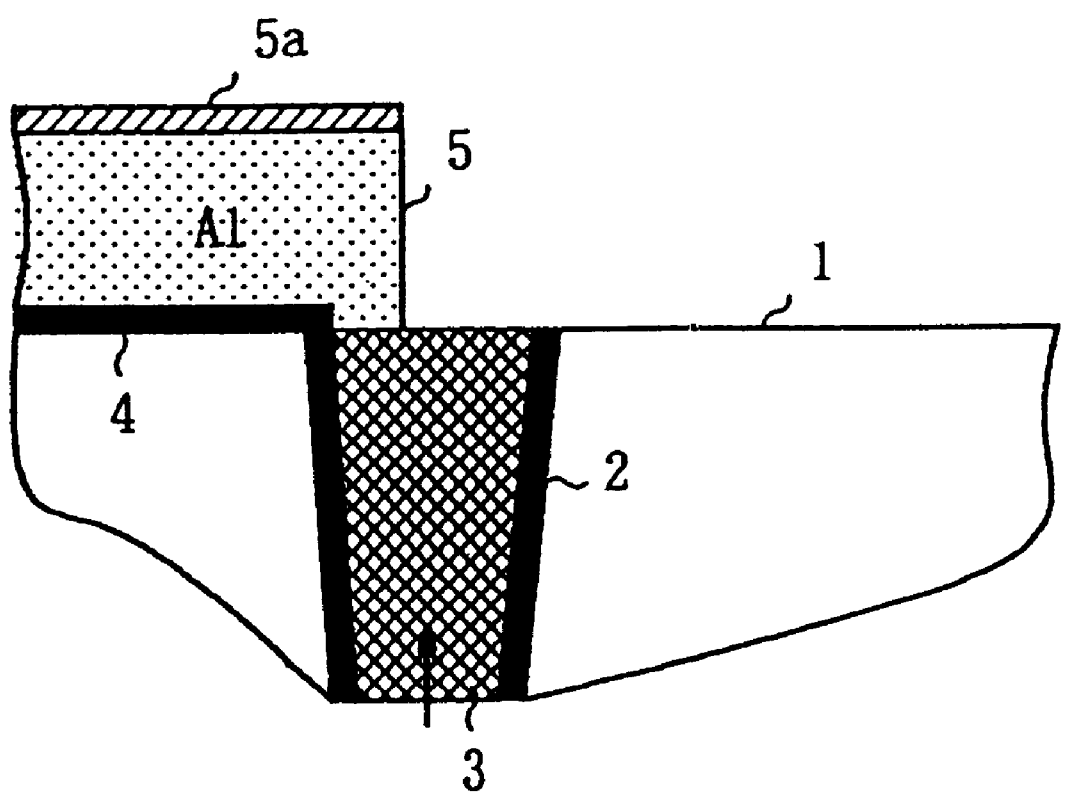
FIG. 5 is a schematic representation showing the structure of a borderless wiring pattern that has been subjected to resist residue removal processing.

A third embodiment of the present invention is now described by reference to FIG. 4. FIG. 4 is a schematic diagram showing a dip type resist residue removal apparatus and method according to a third embodiment.

In the third embodiment, the chamber comprises a transfer space chamber 6A for ensuring a transfer space, and a plurality of cell chambers 6B housing each cell 20 provided for individual step of the resist residue removal process, such as a removal cell or a washing cell.

The transfer space chamber 6A and the cell chamber 6B are each provided with the gas supply pipes connected to the oxidizing gas supply source 14 and the non-oxidizing gas supply source 16, the nozzles, and the changeover valve.

In FIG. 4, the nozzles, the pipes, and the changeover valve are assigned reference numerals corresponding to those shown in FIG. 1. Subscript "a" is suffixed to the reference numerals assigned to the nozzles, the pipes, and the changeover valve relating to the transfer space chamber 6A. Similarly, subscript "b" is suffixed to the reference numerals assigned to the nozzles, the pipes, and the changeover valve relating to the cell chamber 6B.

In the third embodiment, the resist residue removal process is carried out in sequence of a removal fluid processing step, a washing step, and a drying step. In the removal fluid processing step, a semiconductor wafer to be processed is immersed in a predetermined cell 20 and is taken out of the cell after lapse of a predetermined time period. The semiconductor wafer is then immersed in another cell 20 for washing purpose by way of the transfer space chamber 6A, and is thereafter transported to the drying step.

Oxidizing gas is used only for the atmosphere in the space through which the semiconductor wafer is transferred from the removal fluid processing step to the washing step. In the other steps, non-oxidizing gas is used for the atmosphere.

As in the case with the first and second embodiments, for each processing step, control of the atmosphere within the individual chambers must be established within a short period of time such as a few seconds. Therefore, the supply flow rate of oxidizing gas and non-oxidizing gas must be sufficiently high with respect to the volume of the chamber.

Fourth Embodiment

A fourth embodiment of the present invention is now described. The fourth embodiment is directed to a rinsing method and/or washing method for removing resist residue and is characterized in that a fluid to be used for rinsing or washing (e.g., ultrapure water, a fluid specifically designed for rinsing purpose, or a combination thereof) is maintained at a temperature of 20° C. or less. If the semiconductor wafer is rinsed at such a temperature, reaction of aluminum during the rinsing step can be prevented. In order to improve the efficiency of substitution of the residual removal fluid during the rinsing operation, the supply flow rate of rinsing fluid is increased to a large value of 0.5 liter/min per wafer, and the semiconductor wafer is rinsed within a short time period of three minutes or less. As a result, the time during which aluminum reacts in the rinsing operation can be shortened, and sufficient substitution of the residual removal fluid can be effected.

In the fourth embodiment, a sufficient effect can be yielded by carrying out solely the above-described operations. Through combination of the apparatus and methods described with reference to the first through third embodiments, a further improvement in resist residue removal characteristics can be expected.

Fifth Embodiment

A fifth embodiment of the present invention is now described. The fifth embodiment is directed to a draining method of the processing method including a draining step for the purpose of removing resist residue. After completion of the removal fluid processing step, the semiconductor wafer is rotated at a high speed of 500 rpm or more before the washing step is commenced, thereby eliminating the removal fluid from the semiconductor wafer.

Through rotation of the semiconductor wafer at such a rotation speed, mixing of the removal fluid into the washing cell is mitigated, preventing local etching of the aluminum wiring pattern on the plug and precipitation of Cu in the Cu-containing aluminum wiring pattern.

Now, the effects and the advantages of the present invention may be summarized as follows.

The resist residue removal apparatus according to the present invention has the above-described configuration, and the atmosphere within the chamber which houses the semiconductor wafer is controlled according to the treatment to which the semiconductor wafer is subjected, thereby enabling improvement in the yield of a semiconductor device.

Under the resist residue removal method according to the present invention, the atmosphere within the chamber is changed to a specific gas which is non-oxidizing to aluminum at the time of a removal fluid process. Consequently, there can be prevented corrosion of aluminum, which would otherwise be caused through reaction with a chemical.

Under the resist residue removal method according to the present invention, the chamber is filled with gas which is oxidizing to aluminum, after the removal fluid processing and until washing is started. Consequently, the aluminum wiring pattern formed on the plug is oxidized and stabilized, thereby preventing etching of the aluminum wiring pattern during a subsequent washing step.

Under the resist residue removal method according to the present invention, the semiconductor wafer is rotated at a high rotation speed of 500 rpm or more after the removal fluid processing and until washing is started. Consequently, mixing of a removal fluid to a washing cell can be mitigated, thus preventing local etching of the aluminum wiring pattern formed on the plug, thinning of the aluminum wiring pattern, and precipitation of Cu in the Cu-containing aluminum wiring pattern.

Under the resist residue removal method according to the present invention, since the temperature of the fluid used for rinsing is set to 20° C. or less, reaction of aluminum during the rinsing operation can be prevented.

Further, under the resist residue removal method according to the present invention, the supply flow rate of rinsing fluid or washing fluid is set to 0.5 liter/min or more, and the semiconductor wafer is rinsed or washed within a time period of less than three minutes. Consequently, the time during which aluminum reacts in the rinsing step can be shortened, and sufficient substitution of the resist residue fluid can be effected.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-2244, filed on Jan. 7, 1999 including specification, claims, drawings and summary, on which the Convention priority of the present application is based, are incorporated herein by reference in its entirety.

What is claimed is:

1. A method of removing resist residues from a semiconductor wafer having an aluminum wiring pattern thereon, the method comprising the steps of;

processing the wafer with a resist residues removal fluid in a processing chamber;

washing the wafer with a washing fluid in a processing chamber, drying the wafer with a drying gas in a processing chamber, and controlling supply of a gas into the processing chamber according to the step to which the semiconductor wafer is subjected, wherein said gas is one of an oxidizing gas and a non-oxidizing gas.

2. The method according to claim 1, further comprising a step of;

draining the resist residue removal fluid following the step of processing the wafer with a resist residue removal fluid.

3. The method according to claim 2, wherein the draining step is performed by rotation of the semiconductor wafer at a high speed of 500 rpm or more, thereby removing the resist residues removal fluid from the semiconductor wafer.

4. The method according to claim 3, wherein the chamber is filled with an oxidizing gas to aluminum during the draining step.

5. The method according to claim 1, wherein the processing is carried out either in a spray chamber or a single-wafer-processing chamber.

6. The method according to claim 1, wherein the chamber is filled with non-oxidizing gas to aluminum during the process by the resist residues removal fluid.

7. The method according to claim 1, wherein the chamber is filled with an oxidizing gas to aluminum, after completion of the process by the resist removal fluid and until the washing step is commenced.

8. The method according to claim 1, wherein the chamber is filled with a non-oxidizing gas to aluminum during the washing step.

9. The method according to claim 1, wherein the chamber is filled with an oxidizing gas to aluminum after completion of the process by the resist removal fluid and until the washing step is commenced, and further the chamber is filled with a non-oxidizing gas to aluminum during the washing step.

10. The method according to claim 1, wherein the chamber is filled with a non-oxidizing gas to aluminum during the process by resist residues removal fluid; the chamber is filled with an oxidizing gas to aluminum after completion of the process by the resist removal fluid and until the washing step is commenced; and the chamber is filled with a non-oxidizing gas to aluminum during the washing step.

11. The method according to claim 1, further comprising a step of ;

rinsing the wafer by a rinsing liquid in the temperature range at 20° C. or less following completion of the process by the resist residues removal fluid.

12. The method according to claim 11, wherein a flow supply rate of the rinsing fluid is set to 0.5 liter/min per wafer or more, and the semiconductor wafer is rinsed within a time period of three minutes or less.

13. The method according to claim 1, wherein said controlling step includes the step of supplying respectively an oxidizing gas and a non-oxidizing gas alternately from first and second sources.

14. The method according to claim 13, wherein said controlling step further includes switching a changeover valve between said first source and said second source.

15. The method according to claim 1, wherein the processing chamber used in at least one of the processing, washing, and drying steps is different from the processing chamber used in the other of the processing, washing, and drying steps.

16. A method of removing resist residues from a semiconductor wafer having an aluminum wiring pattern thereon, the method comprising the steps of:

processing the wafer with a resist residues removal fluid in a process chamber;

rinsing the wafer with a rinsing fluid in a processing chamber;

draining the resist residue removal fluid after said rinsing step; and thereafter washing the wafer with a washing fluid in a processing chamber, wherein said draining step is performed in an oxidizing gas atmosphere.

* * * * *